(12) United States Patent
Wu et al.

(10) Patent No.: US 9,685,223 B2
(45) Date of Patent: Jun. 20, 2017

(54) VOLTAGE CONTROLLER

(71) Applicant: Taiwan Semiconductor Manufacturing Company Limited, Hsin-Chu (TW)

(72) Inventors: Wei-Cheng Wu, Hsinchu (TW); Wei Min Chan, Sindian (TW); Yen-Huei Chen, Jhudong Township (TW); Hung-Jen Liao, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/079,825

(22) Filed: Nov. 14, 2013

(65) Prior Publication Data

US 2015/0131366 A1  May 14, 2015

(51) Int. Cl.
  *G11C 11/417* (2006.01)
  *G11C 11/419* (2006.01)

(52) U.S. Cl.
  CPC .......... *G11C 11/417* (2013.01); *G11C 11/419* (2013.01)

(58) Field of Classification Search
  CPC ............................ G11C 11/417; G11C 11/419
  USPC .............. 365/102, 115, 149, 189.06, 233.18
  See application file for complete search history.

(56) References Cited

U.S. PATENT DOCUMENTS

| | | | | |
|---|---|---|---|---|
| 5,534,789 A * | 7/1996 | Ting | ................. | H03K 19/00384 326/21 |
| 5,559,465 A * | 9/1996 | Shah | ................ | H03K 17/04206 326/17 |
| 5,687,123 A * | 11/1997 | Hidaka | ..................... | G11C 5/14 365/174 |
| 5,999,459 A * | 12/1999 | Liu | .......................... | G11C 8/08 365/189.05 |
| 6,031,411 A * | 2/2000 | Tsay | ........................ | G05F 3/205 327/534 |
| 6,229,740 B1 * | 5/2001 | Ogura | .................... | G11C 5/143 327/390 |
| 6,327,195 B2 * | 12/2001 | Tomishima | .............. | G11C 8/08 365/189.11 |

(Continued)

OTHER PUBLICATIONS

Corresponding Taiwan application, Taiwan Office action dated Oct. 22, 2015, 9 pages.
Taiwan Office action dated Jul. 28, 2015, 7 pages.

*Primary Examiner* — Vu Le
*Assistant Examiner* — Sung Cho
(74) *Attorney, Agent, or Firm* — Cooper Legal Group, LLC

(57) ABSTRACT

A voltage controller is provided that is connected to a voltage inducing circuit which is connected to a static random-access memory (SRAM) cell. The voltage controller comprises a voltage clamping circuit and a pull up circuit. The voltage clamping circuit comprises one or more transistors. The voltage clamping circuit is configured to inhibit a second voltage of a second signal at a second node of the voltage inducing circuit from exceeding a first specified voltage threshold so that a fifth voltage of a fifth signal at a fifth node of the voltage inducing circuit is inhibited from exceeding a second specified voltage threshold. The pull up circuit is configured to maintain the second voltage substantially equal to a specified pull up voltage. The fifth node is connected to the SRAM cell, and a voltage to which the SRAM cell is exposed is thereby controlled.

20 Claims, 6 Drawing Sheets

(56) References Cited

U.S. PATENT DOCUMENTS

| | | | | |
|---|---|---|---|---|
| 6,327,213 | B1* | 12/2001 | Ooishi | G11C 5/14 |
| | | | | 365/189.07 |
| 6,400,615 | B2* | 6/2002 | Einaga | G11C 5/145 |
| | | | | 365/189.06 |
| 2005/0018453 | A1* | 1/2005 | Wofford | H02M 1/32 |
| | | | | 363/41 |
| 2006/0114740 | A1* | 6/2006 | Watanabe | G11C 11/22 |
| | | | | 365/230.06 |
| 2008/0094920 | A1* | 4/2008 | Hsu | G11C 11/413 |
| | | | | 365/189.09 |
| 2009/0161449 | A1* | 6/2009 | Yamagami | G11C 11/419 |
| | | | | 365/189.16 |
| 2009/0235171 | A1* | 9/2009 | Adams | G11C 7/1096 |
| | | | | 715/723 |
| 2010/0232244 | A1* | 9/2010 | Hirabayashi | G11C 7/12 |
| | | | | 365/208 |
| 2012/0170391 | A1* | 7/2012 | Janardan | G11C 7/04 |
| | | | | 365/194 |
| 2012/0206988 | A1* | 8/2012 | Song | G11C 5/145 |
| | | | | 365/203 |
| 2013/0094308 | A1* | 4/2013 | Yang | G11C 8/08 |
| | | | | 365/191 |

* cited by examiner

VOLTAGE CONTROLLER

BACKGROUND

Static random-access memory (SRAM) is a type of semiconductor memory. SRAM uses bistable latching circuitry to store data. Sometimes a voltage inducing circuit is connected to an SRAM cell via one or more components.

DETAILED DESCRIPTION

Figure 1:
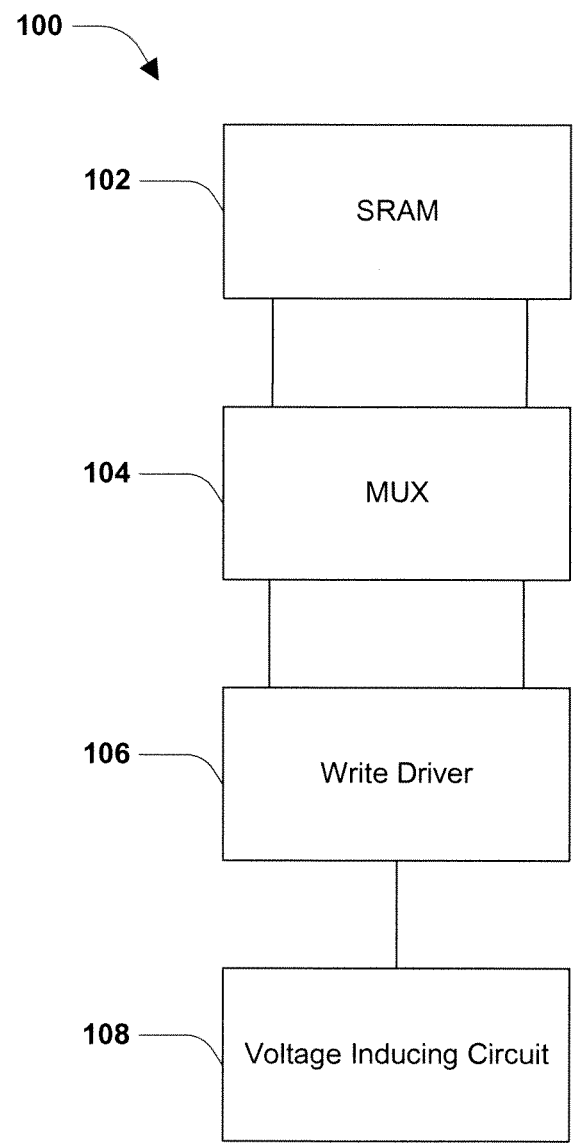
FIG. 1 is an illustration of an arrangement, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

FIG. 1 illustrates an arrangement 100 for semiconductor memory. The arrangement 100 comprises a static random-access memory (SRAM) cell 102, a multiplexer 104, a write driver 106 and a voltage inducing circuit 108. The SRAM cell 102 is connected to the multiplexer 104. The multiplexer 104 is connected to the write driver 106. The write driver 106 is connected to the voltage inducing circuit 108. During a write cycle of the SRAM cell, the voltage inducing circuit 108 is configured to induce a voltage on a connection between the voltage inducing circuit 108 and the write driver 106 for a temporary period of time, which facilitates writing data to the SRAM cell 102.

Figure 2:
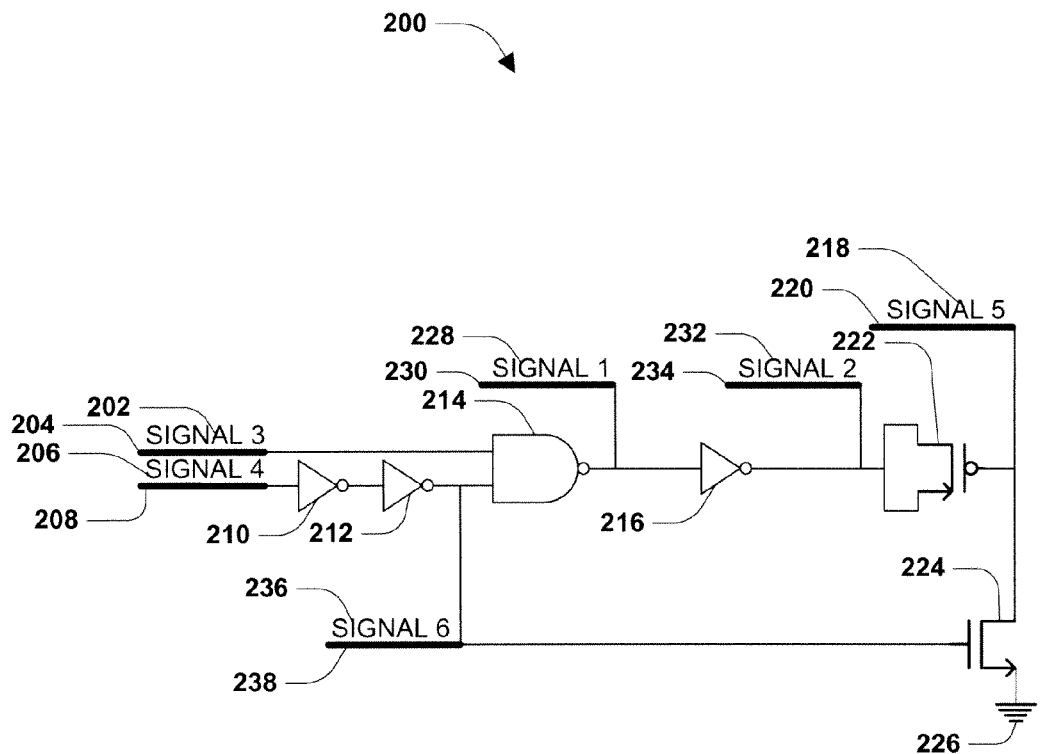
FIG. 2 is an illustration of a circuit, according to some embodiments.

FIG. 2 illustrates a voltage inducing circuit 200. In some embodiments the voltage inducing circuit 200 corresponds to the voltage inducing circuit 108 of FIG. 1, such that a fifth node 220 of the voltage inducing circuit 200 is connected to an SRAM cell via one or more components, such as at least one of a write driver or a multiplexer. In some embodiments, a negative bit-line technique is implemented in the voltage inducing circuit 200. The voltage inducing circuit 200 comprises a first not gate 210, a second not gate 212, a third not gate 216, a nand gate 214, a first transistor 222 and a second transistor 224. A first input of the nand gate 214 is configured to receive a third signal 202 with a third voltage at a third node 204. An input of the first not gate 210 is configured to receive a fourth signal 206 with a fourth voltage at a fourth node 208. An output of the first not gate 210 is connected to an input of the second not gate 212. An output of the second not gate 212 is connected to a second input of the nand gate 214. An output of the nand gate 214 is connected to an input of the third not gate 216, where a first node 230 with a first signal 228 with a first voltage exists. A second node 234 with a second signal 232 with a second voltage is connected to an output of the third not gate 216, and is respectively connected to a source and to a drain of the first transistor 222. A gate of the first transistor 222 is connected to the fifth node 220 having a fifth signal 218 with a fifth voltage, which is connected to a drain of the second transistor 224. A source of the second transistor 224 is connected to a second voltage source 226. In some embodiments, the second voltage source 226 is ground. A gate of the second transistor 224 is connected to a sixth node 238 with a sixth signal 236 with a sixth voltage which is connected to the output of the second not gate 212.

During a write cycle of the SRAM cell, the voltage inducing circuit 200 is configured to induce a voltage at the fifth node 220 for a temporary period of time. In some embodiments, the fifth node 220 is connected to the SRAM cell via one or more components. Before the write cycle occurs, the first voltage at the first node 230 is within a second voltage range. In some embodiments, the second voltage range comprises zero volts. During this time, the second voltage at the second node 234 is within a third voltage range. In some embodiments, the third voltage range comprises a voltage substantially equal to a first source voltage provided by a first voltage source. In some embodiments, the second voltage is substantially equal to the voltage provided by the first voltage source. During the write cycle, the first voltage changes from a voltage within the second voltage range to a voltage within a first voltage range which causes the second voltage to change from a voltage within the third voltage range to a voltage within the fourth voltage range. The second voltage changing from a voltage within the third voltage range to a voltage within the fourth voltage range causes the fifth voltage to increase to a fifth voltage peak level for a specified amount of time. In some embodiments, the fifth voltage increases negatively. In some embodiments, the fifth voltage peak level is negative.

In some embodiments, when the first source voltage increases, the second voltage also increases if the second voltage is within the third voltage range. In some embodiments, when the second voltage increases, the fifth voltage peak level also increases. If the second voltage becomes too great, the fifth voltage peak level is at a value that damages one or more components comprised within at least one of the SRAM cell, the multiplexer, the write driver or the voltage inducing circuit 200, in some embodiments.

Figure 3:
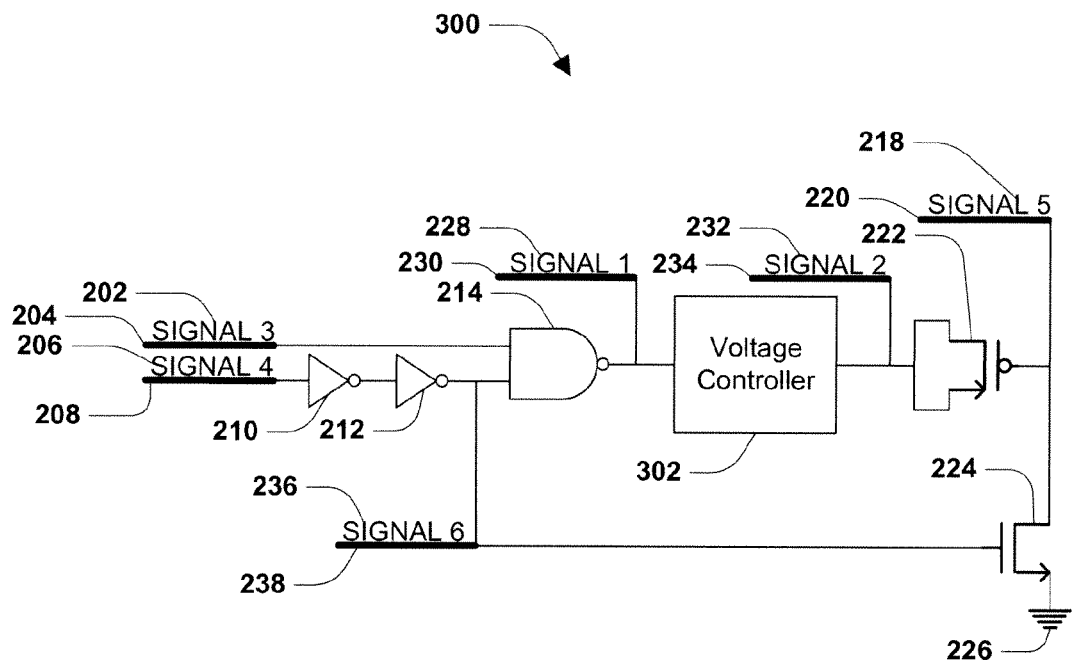
FIG. 3 is an illustration of a circuit, according to some embodiments.

In FIG. 3, a voltage controller 302 is introduced to the voltage inducing circuit 200 that replaces the not gate 216 to form a voltage inducing circuit 300, according to some embodiments. In some embodiments the voltage inducing circuit 300 corresponds to the voltage inducing circuit 108 of FIG. 1, such that the fifth node 220 of the voltage inducing circuit 300 is connected to an SRAM cell via one or more components, such as at least one of a write driver or a multiplexer. In some embodiments, the voltage inducing circuit 300 is a clamped voltage inducing circuit, such as due to the implementation of the voltage controller 302. In some embodiments, a negative bit-line technique is implemented in the voltage inducing circuit 300. The voltage inducing circuit 300 comprises the first not gate 210, the second not gate 212, the voltage controller 302, the nand gate 214, the first transistor 222 and the second transistor 224. The third node 204 with the third signal 202 with the third voltage is connected to the first input of the nand gate 214. The fourth node 208 with the fourth signal 206 with the fourth voltage is connected to the input of the first not gate 210. The output of the first not gate 210 is connected to the input of the second not gate 212. The output of the second not gate 212 is connected to the second input of the nand gate 214. The output of the nand gate 214 is connected to an input of the voltage controller 302, where the first node 230 with the first signal 228 with the first voltage exists. The second node 234 with the second signal 232 with the second voltage is connected to an output of the voltage controller 302, and is respectively connected to the source and to the drain of the first transistor 222. The gate of the first transistor 222 is connected to the fifth node 220 with the fifth signal 218 with the fifth voltage, which is connected to the drain of the second transistor 224. The source of the second transistor 224 is connected to the second voltage source 226. The gate of the second transistor 224 is connected to the sixth node 238 with the sixth signal 236 with the sixth voltage which is connected to the output of the second not gate 212.

During a write cycle of the SRAM cell, the voltage inducing circuit 300 is configured to induce a voltage at the fifth node 220 for a temporary period of time. In some embodiments, the fifth node 220 is connected to the SRAM cell via one or more components. Before the write cycle occurs, the first voltage at the first node 230 is within a second voltage range. In some embodiments, the second voltage range comprises zero volts. During this time, the second voltage at the second node 234 is within a third voltage range. In some embodiments, the third voltage range comprises a voltage substantially equal to the voltage provided by a first voltage source connected to the voltage inducing circuit 300. In some embodiments, the second voltage is substantially equal to the voltage provided by the first voltage source. During the write cycle, the first voltage changes from a voltage within the second voltage range to a voltage within a first voltage range which causes the second voltage to change from a voltage within the third voltage range to a voltage within a fourth voltage range. In some embodiments, the fourth voltage range comprises zero volts. In some embodiments, the second voltage is substantially equal to zero volts. The action of the second voltage changing to a voltage within the fourth voltage range causes the fifth voltage to increase to a fifth voltage peak level for a specified amount of time. In some embodiments, the fifth voltage increases negatively.

In some embodiments, when the first source voltage increases, the second voltage also increases, if the second voltage is within the third voltage range. When the second voltage increases, the fifth voltage peak level also increases. The voltage controller 302 is configured to inhibit the second voltage from exceeding a first specified voltage threshold. The voltage controller 302 is configured so that the first specified voltage threshold is at a voltage that inhibits the fifth voltage peak level from exceeding a second specified voltage threshold. The second specified voltage threshold comprises a value less than a voltage believed to damage components comprised within at least one of the SRAM cell, the multiplexer, the write driver or the voltage inducing circuit 300.

Figure 4:
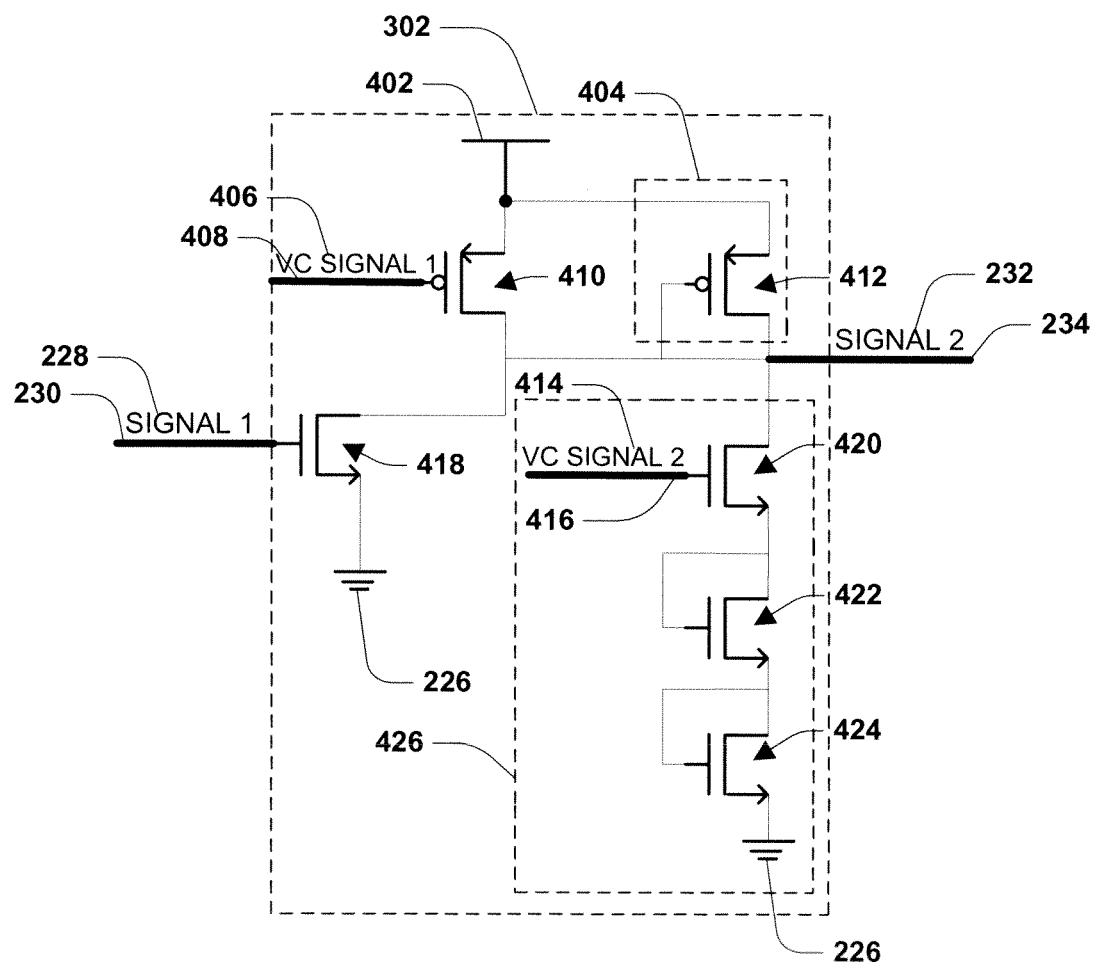
FIG. 4 is an illustration of a circuit, according to some embodiments.

The voltage controller 302 is illustrated in FIG. 4, according to some embodiments. The voltage controller 302 comprises a voltage clamping circuit 426, a pull up circuit 404, a first voltage controller transistor 410 and a second voltage controller transistor 418. In some embodiments, the first voltage controller transistor 410 comprises a PMOS transistor. In some embodiments, the second voltage controller transistor 418 comprises an NMOS transistor. The pull up circuit 404 and a source of the first voltage controller transistor 410 are respectively connected to a first voltage source 402. A gate of the first voltage controller transistor 410 is configured to receive a first voltage controller signal 406 at a first voltage controller node 408. In some embodiments, the first voltage controller signal 406 is generated by a signal generator. A drain of the first voltage controller transistor 410 is respectively connected to the pull up circuit 404, to the voltage clamping circuit 426 and to a drain of the second voltage controller transistor 418, where the second signal 232 at the second node 234 exists. A gate of the second voltage controller transistor 318 is configured to receive the first signal 228 at the first node 230. A source of the second voltage controller transistor 418 is connected to the second voltage source 226.

The voltage clamping circuit 426 comprises a clamp enabling transistor 420, a first voltage clamping transistor 422 and a second voltage clamping transistor 424. In some embodiments, the clamp enabling transistor 420 comprises an NMOS transistor. In some embodiments, the first voltage clamping transistor 422 comprises an NMOS transistor. In some embodiments, the second voltage clamping transistor 424 comprises an NMOS transistor. A drain of the clamp enabling transistor 420 is connected to the second node 234. A gate of the clamp enabling transistor 420 is configured to receive a second voltage controller signal 414 at a second voltage controller node 414. In some embodiments, the second voltage controller signal 414 is generated by a signal generator. A source of the clamp enabling transistor 420 is connected to a drain of the first voltage clamping transistor 422. The first voltage clamping transistor 422 is diode connected, in some embodiments. In this way, the drain of the first voltage clamping transistor 422 is connected to a gate of the first voltage clamping transistor 422. A source of the first voltage clamping transistor 422 is connected to a drain of the second voltage clamping transistor 424. The second voltage clamping transistor 424 is diode connected, in some embodiments. In this way, the drain of the second voltage clamping transistor 424 is connected to a gate of the second voltage clamping transistor 424. A source of the second voltage clamping transistor 424 is connected to the second voltage source 226.

In some embodiments, the voltage clamping circuit 426 comprises both one or more PMOS transistors and one or more NMOS transistors. In some embodiments, the voltage clamping circuit 426 comprises merely one or more PMOS transistors. In some embodiments, the voltage clamping circuit 426 comprises merely one or more NMOS transistors. In some embodiments, the voltage clamping circuit 426 comprises diodes.

The pull up circuit comprises a pull up transistor 412. In some embodiments, the pull up transistor 412 comprises a PMOS transistor. In some embodiments, the pull up transistor 412 is diode connected. A source of the pull up transistor 412 is connected to the first voltage source 402. A gate of the pull up transistor 412 is connected to a drain of the pull up transistor 412. The drain of the pull up transistor 412 is connected to the second node 234.

The first voltage controller transistor 410 is configured to connect the first voltage source 402 to the second node 234 when the first voltage controller voltage at the first voltage controller node 408 is within a fifth voltage range. The first voltage controller transistor 410 is configured to maintain a disconnection between the first voltage source 402 and the second node 234 when the first voltage controller voltage at the first voltage controller node 408 is within a sixth voltage range.

The second voltage controller transistor 418 is configured to connect the second voltage source 226 to the second node 234 when the first voltage at the first node 230 is within a first voltage range. The second voltage controller transistor 418 is configured to maintain a disconnection between the second voltage source 226 and the second node 234 when the first voltage at the first node 230 is within a second voltage range.

The voltage clamping circuit 426 is configured to inhibit the second voltage at the second node 234 from exceeding the first specified voltage threshold. The first specified voltage threshold is increased by inserting one or more diode connected transistors to the voltage clamping circuit 426, in some embodiments. The specified voltage threshold is decreased by removing one or more diode connected transistors from the voltage clamping circuit 426, in some embodiments. The clamp enabling transistor 420 is configured to couple the second voltage at the second node 234 to the drain of the first voltage clamping transistor 422 when a second voltage controller voltage at the second voltage controller node 416 is within a seventh voltage range. In this way, when the second voltage controller voltage at the second voltage controller node 416 is within the seventh voltage range, the second voltage at the second node 234 will be inhibited from exceeding the first specified voltage threshold. The clamp enabling transistor 420 is configured to maintain a disconnection between the second node 234 and the drain of the first voltage clamping transistor 422 when the second voltage controller voltage at the second voltage controller node 416 is within an eighth voltage range. In this way, when the second voltage controller voltage at the second voltage controller node 416 is within the eighth voltage range, the second voltage at the second node 234 will be able to exceed the first specified voltage threshold.

The pull up circuit 404 is configured to provide a connection between the second node 234 and the first voltage source 402. At least one of a channel length of the pull up transistor 412 or a channel width of the pull up transistor 412 is adjusted to configure the strength of the connection. The strength of the connection is configured such that when the second node 234 is coupled to the second voltage source 226, the connection will have zero or some effect on the second voltage at the second node 234. The strength of the connection is configured such that when the second node 234 is not coupled to the second voltage source 226 and is coupled to the drain of the first voltage clamping transistor 422, the connection pulls the second voltage to a specified pull up voltage so that the second voltage is at the specified pull up voltage. The specified pull up voltage is adjusted by at least one of changing the channel width of the pull up transistor, changing the channel length of the pull up transistor, adding one or more transistors to the pull up circuit or removing one or more transistors from the pull up circuit.

Figure 5:
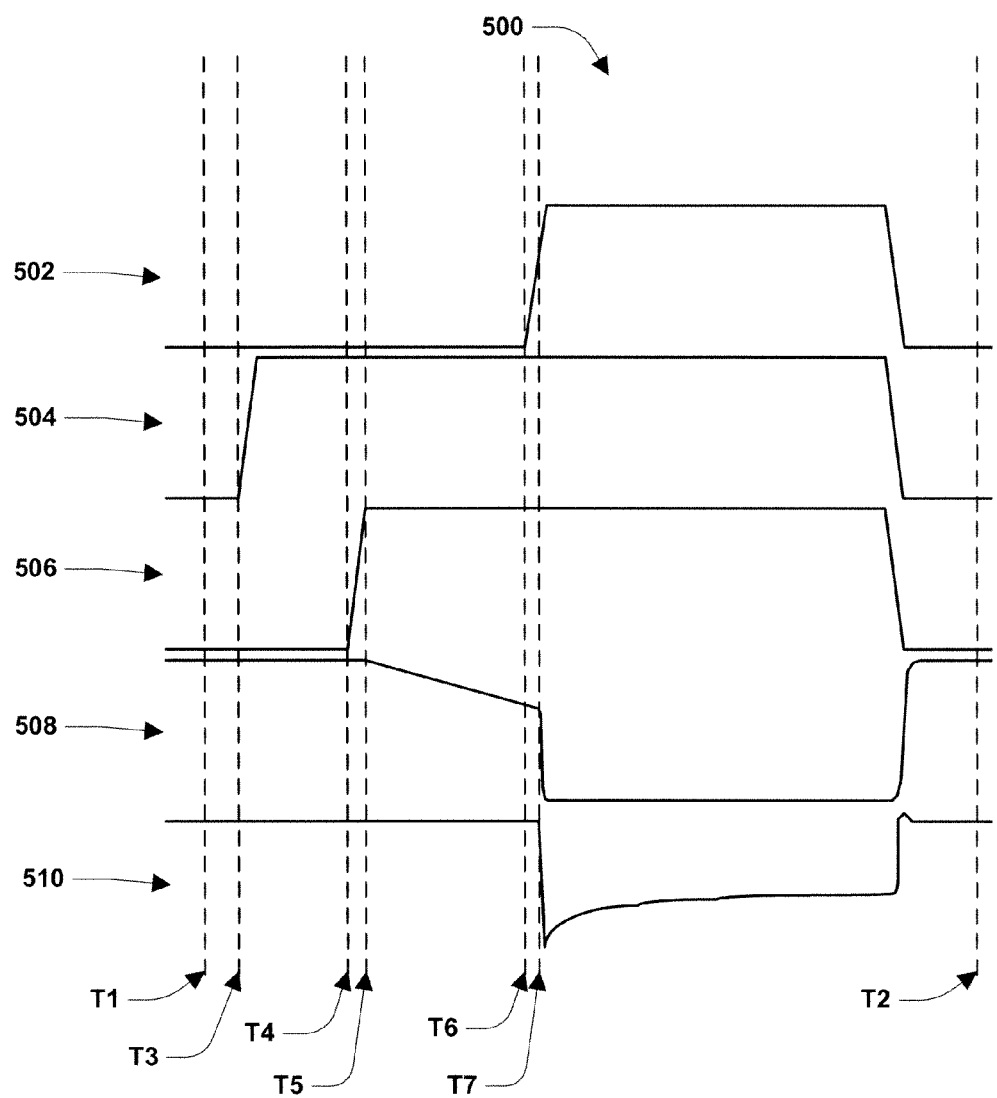
FIG. 5 is an illustration of waveforms, according to some embodiments.

FIG. 5 illustrates waveforms of various signals in an embodiment of the voltage inducing circuit 300. A waveform 502 illustrates the values of the first voltage at the first node 230 from a first point in time T1 to a second point in time T2. A waveform 504 illustrates the values of the first voltage controller voltage at the first voltage controller node 408 from the first point in time T1 to the second point in time T2. A waveform 506 represents the values of the second voltage controller voltage at the second voltage controller node 414 from the first point in time T1 to the second point in time T2. A waveform 508 represents the values of the second voltage at the second node 234 from the first point in time T1 to the second point in time T2. A waveform 510 represents the values of the fifth voltage at the fifth node 220 from the first point in time T1 to the second point in time T2. The first point in time T1 occurs before a write cycle of an SRAM cell is implemented by the voltage inducing circuit 300, and the second point in time T2 occurs after the write cycle is implemented by the voltage inducing circuit 300.

The waveform 502 illustrates that, at the first point in time T1, the first voltage is within a second voltage range that comprises zero volts. The waveform 508 illustrates that, at the first point in time T1, the second voltage is substantially equal to the first source voltage provided by the first voltage source 402. In this embodiment, the first source voltage is larger than a first specified voltage threshold. In this way, the second voltage is larger than the first specified voltage threshold. The waveform 504 illustrates that, at the first point in time T1, the first voltage controller voltage is substantially equal to zero volts. The waveform 506 illustrates that, at the first point in time T1, the second voltage controller signal is substantially equal to zero volts. The waveform 510 illustrates that, at the first point in time T1, the fifth voltage is substantially equal to zero volts. The waveform 504 illustrates that at a third point in time T3, the first voltage controller voltage begins to change from zero volts to a voltage within a sixth voltage range. In this way, the first voltage controller transistor 410 becomes deactivated. In this way, the second node 234 is not connected to the first voltage source 402 through the first voltage controller transistor 410. At a fourth point in time T4, the waveform 506 illustrates that the second voltage controller voltage begins to change from zero volts to a voltage within a seventh voltage range. In this way, the clamp enabling transistor 420 becomes activated. In this way, the second node 234 is connected to the drain of the first voltage clamping transistor 422. The waveform 508 shows that at a fifth point in time T5, after the second voltage controller voltage changes from zero volts to a voltage with the seventh voltage range, the second voltage starts to decrease. At a sixth point in time T6, the waveform 502 illustrates that the first voltage change begins to change from zero volts to a voltage within a first voltage range. In this way, the second voltage controller transistor 418 becomes activated. In this way, at a seventh point in time T7, the second node 234 is connected to the second voltage source 226. In this embodiment, the second voltage source 226 is ground. In this way, the second voltage is pulled to zero volts. At the seventh point in time T7, the second voltage is equal to the first specified voltage threshold or less than the first specified voltage threshold. The waveform 510 shows that at the seventh point in time T7, the fifth voltage begins to increase negatively from zero volts to the fifth voltage peak level.

If the second voltage is higher than the first specified voltage threshold at the seventh point in time T7, the fifth voltage increases to a fifth voltage peak level that is large enough to damage one or more components comprised within at least one of the SRAM cell, the multiplexer, the write driver or the voltage inducing circuit 200, according to some embodiments.

Figure 6:
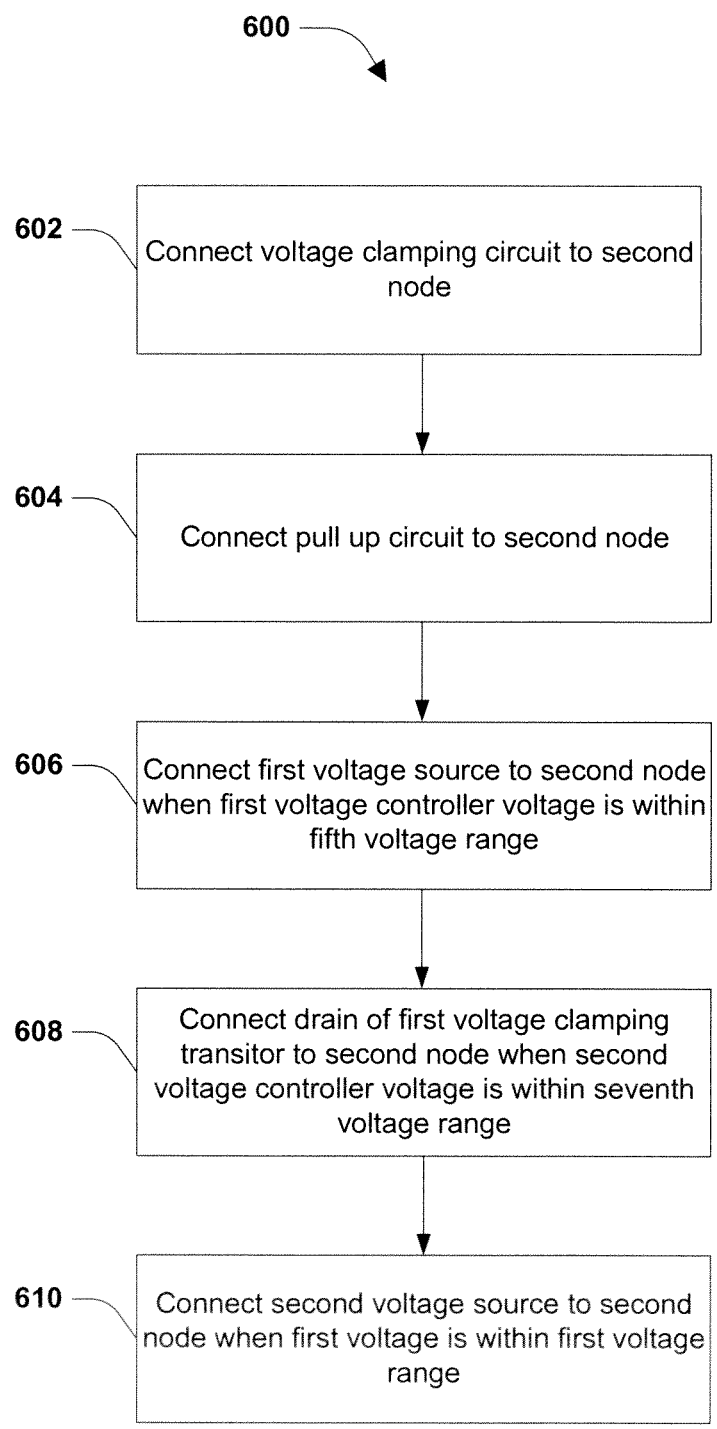
FIG. 6 is a flow diagram illustrating a method for operating a voltage inducing circuit, according to some embodiments.

A method 600 to operate a voltage inducing circuit connected to an SRAM cell is illustrated in FIG. 6. At 602, a voltage clamping circuit is connected to a second node of the voltage inducing circuit. The voltage clamping circuit is configured to inhibit a second voltage of a second signal at the second node from exceeding a first specified voltage threshold. At 604, a pull up circuit is connected to the second node. The pull up circuit is configured to maintain the second voltage substantially equal to a specified pull up voltage. At 606, a first voltage source is connected to the second node when a first voltage controller node has a first voltage controller voltage that is within a fifth voltage range. At 608, a drain of a first voltage clamping transistor is connected to the second node when a second voltage controller node has a second voltage controller voltage that is within a seventh voltage range. At 610, a second voltage source is connected to the second node when a first node has a first voltage that is within a first voltage range.

According to some embodiments, a voltage controller configured to couple to a voltage inducing circuit that is connected to a static random-access memory (SRAM) cell is provided that comprises a voltage clamping circuit, a first voltage controller transistor and a second voltage controller transistor. The voltage clamping circuit comprises a clamp enabling transistor that has a drain connected to a second node of the voltage inducing circuit and a source connected to a first voltage clamping transistor. The voltage clamping circuit is configured to inhibit a second voltage of a second signal at the second node from exceeding a first specified voltage threshold to inhibit a fifth voltage of a fifth signal at a fifth node of the voltage inducing circuit from exceeding a second specified voltage threshold, where the fifth node is connected to the SRAM cell. In some embodiments, the fifth node is connected to the SRAM cell via one or more components. In some embodiments, the fifth node is directly connected to the SRAM cell. The first voltage controller transistor is connected to a first voltage source and to the second node. The second voltage controller transistor is connected to a second voltage source and to the second node.

According to some embodiments, a voltage inducing circuit connected to a static random-access memory (SRAM) cell is provided that comprises a voltage clamping circuit connected to a second node of the voltage inducing circuit. The voltage clamping circuit is configured to inhibit a second voltage of a second signal at the second node from exceeding a first specified voltage threshold to inhibit a fifth voltage of a fifth signal at a fifth node of the voltage inducing circuit from exceeding a second specified voltage threshold, where the fifth node is connected to the SRAM cell. In some embodiments, the fifth node is connected to the SRAM cell via one or more components. In some embodiments, the fifth node is directly connected to the SRAM cell. The voltage inducing circuit also comprises a pull up circuit that comprises a pull up transistor that has a source connected to a first voltage source and a drain connected to the second node. The pull up circuit is configured to maintain the second voltage substantially equal to a specified pull up voltage.

According to some embodiments, a method of operating a voltage inducing circuit connected to a static random-access memory (SRAM) cell is provided that comprises connecting a voltage clamping circuit to a second node of the voltage inducing circuit, the voltage clamping circuit configured to inhibit a second voltage of a second signal at the second node from exceeding a first specified voltage threshold.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed as to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

Further, unless specified otherwise, "first," "second," "third," "fourth," "fifth," "sixth," "seventh," "eighth," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or identical channels or the same channel. In an example, unless specified otherwise, the presence of a "second" does not necessarily imply the presence of a "first," the presence of a "third" does not necessarily imply the presence of a "first" or "second," the presence of a "fourth" does not necessarily imply the presence of a "first," "second," or "third," the presence of a "fifth" does not necessarily imply the presence of a "first," "second," "third," or "fourth," the presence of a "sixth" does not necessarily imply the presence of a "first," "second," "third," "fourth," or "fifth," the presence of a "seventh" does not necessarily imply the presence of a "first," "second," "third," "fourth," "fifth," or "sixth," the presence of an "eighth" does not necessarily imply the presence of a "first," "second," "third," "fourth," "fifth," "sixth," or "seventh," and the presence of a "ninth" does not necessarily imply the presence of a "first," "second," "third," "fourth," "fifth," "sixth," "seventh," or "eighth."

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A voltage controller, configured to couple to a voltage inducing circuit that is connected to a static random-access memory (SRAM) cell, comprising:
    a voltage clamping circuit comprising a clamp enabling transistor that has a drain connected to a second node of the voltage inducing circuit and a source connected to a first voltage clamping transistor, the voltage clamping circuit configured to inhibit a second voltage of a second signal at the second node from exceeding a first specified voltage threshold to inhibit a fifth voltage of a fifth signal at a fifth node of the voltage inducing circuit from exceeding a second specified voltage threshold, where the fifth node is connected to the SRAM cell;
    a first voltage controller transistor connected to a first voltage source and to the second node; and
    a second voltage controller transistor connected to a second voltage source and to the second node.

2. The voltage controller of claim 1, the voltage clamping circuit comprising one or more MOS transistors.

3. The voltage controller of claim 1, the voltage clamping circuit comprising one or more diodes.

4. The voltage controller of claim 1, the voltage clamping circuit comprising one or more diode connected MOS transistors.

5. The voltage controller of claim 1, where a gate of the first voltage controller transistor is configured to receive a first voltage controller signal to connect the first voltage source to the second node when the first voltage controller signal has a first voltage controller voltage within a fifth voltage range.

6. The voltage controller of claim 5, where a gate of the second voltage controller transistor is configured to receive a first signal to connect the second voltage source to the second node when a second voltage controller signal has a second voltage controller voltage within a first voltage range.

7. The voltage controller of claim 6, the voltage clamping circuit comprising a second voltage clamping transistor connected to the first voltage clamping transistor.

8. The voltage controller of claim 7, a gate of the clamp enabling transistor configured to receive the second voltage controller signal to connect the second node to the first voltage clamping transistor when the second voltage controller voltage is within a seventh voltage range.

9. The voltage controller of claim 8, the clamp enabling transistor configured to maintain a disconnection between the second node and the first voltage clamping transistor when the second voltage controller voltage is within an eighth voltage range.

10. The voltage controller of claim 9, comprising a pull up circuit configured to maintain the second voltage substantially equal to a specified pull up voltage.

11. The voltage controller of claim 10, the pull up circuit comprising at least one of a transistor or a diode.

12. A voltage inducing circuit, connected to a static random-access memory (SRAM) cell, comprising:
    a voltage clamping circuit connected to a second node of the voltage inducing circuit and comprising a clamp enabling transistor that has a drain connected to the second node of the voltage inducing circuit and a source connected to a first voltage clamping transistor, the voltage clamping circuit configured to inhibit a second voltage of a second signal at the second node from exceeding a first specified voltage threshold to inhibit a fifth voltage of a fifth signal at a fifth node of the voltage inducing circuit from exceeding a second specified voltage threshold, where the fifth node is connected to the SRAM cell;
    a pull up circuit comprising a pull up transistor that has a source connected to a first voltage source and a drain connected to the second node, the pull up circuit configured to maintain the second voltage substantially equal to a specified pull up voltage; and
    a first voltage controller transistor having a source connected to the source of the pull up circuit and a drain connected to the drain of the pull up circuit.

13. The voltage inducing circuit of claim 12, the voltage clamping circuit inhibiting the second voltage when the first voltage source has a first source voltage greater than a first specified source voltage threshold.

14. The voltage inducing circuit of claim 13, the clamp enabling transistor corresponding to a MOS transistor.

15. The voltage inducing circuit of claim 13, comprising a second voltage controller transistor connected to a second voltage source and to the second node.

16. The voltage inducing circuit of claim 13, the voltage clamping circuit comprising one or more diodes.

17. The voltage inducing circuit of claim 16, the first specified voltage threshold and the first specified source voltage threshold respectively subject to configuration by increasing or decreasing the number of diodes comprised within the voltage clamping circuit.

18. A method of operating a voltage inducing circuit connected to a static random-access memory (SRAM), comprising:
    applying a second voltage controller signal to a gate of a clamp enabling transistor of a voltage clamping circuit to connect a second voltage source to a second node of the voltage inducing circuit, wherein a second voltage of a second signal at the second node is reduced to a first specified voltage threshold responsive to the second node being coupled to the second voltage source via the clamp enabling transistor; and
    activating a second voltage controller transistor, connected to the second node, after the second voltage is reduced to the first specified voltage threshold, wherein the second voltage of the second signal at the second node is further reduced below the first specified voltage threshold responsive to the second node being coupled to the second voltage source via the second voltage controller transistor.

19. The method of claim 18, comprising connecting a pull up circuit to the second node to assist in maintaining the second voltage at the first specified voltage threshold.

20. The method of claim 18, comprising connecting a first voltage source to the second node when a first voltage controller signal has a first voltage controller voltage within a fifth voltage range.

* * * * *